United States Patent
Deluga et al.

(10) Patent No.: US 7,357,658 B1
(45) Date of Patent: Apr. 15, 2008

(54) CARD RETENTION MECHANISM

(75) Inventors: Ronald E. Deluga, Houston, TX (US);
Steven S. Homer, Houston, TX (US);
Paul J. Doczy, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/534,995

(22) Filed: Sep. 25, 2006

(51) Int. Cl.
*H01R 13/62* (2006.01)

(52) U.S. Cl. .................................... 439/327; 439/541.5

(58) Field of Classification Search ............. 439/541.5, 439/325–328
See application file for complete search history.

(56) References Cited

U.S. PATENT DOCUMENTS

| | | | | |
|---|---|---|---|---|
| 5,277,611 A | * | 1/1994 | Berek et al. | 439/325 |
| 6,906,670 B2 | * | 6/2005 | Shi | 343/702 |
| 7,134,896 B1 | * | 11/2006 | Chen | 439/326 |

* cited by examiner

*Primary Examiner*—Ross Gushi

(57) ABSTRACT

A card retention mechanism comprises a first and second brackets. The first and second brackets are mountable to a circuit board. Further, the first and second brackets are adapted to retain a circuit card therebetween. The second bracket comprises an exposed region that exposes an electrical contact of the card to be exposed to enable electrical connection of a conductor thereto.

20 Claims, 2 Drawing Sheets

CARD RETENTION MECHANISM

BACKGROUND

Many electronic systems including computers, such as notebook computers, permit one or more add-in cards to be installed into the system to expand the system's capability. One such capability that can be expanded is the ability of the system to wirelessly communicate with other systems. Adding a wireless card to the system permits the system to transmit and receive wireless communications. Different types of wireless protocols are available. By way of example, one wireless protocol may be a protocol that is useful to implement wireless local area networks (LANs). Another protocol enables the system to participate as part of a wireless wide area network (WAN). Generally, physically separate wireless cards are used to implement disparate wireless protocols. However, adding multiple wireless cards into a space-constrained system, such as a notebook computer, is problematic.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect, direct, optical or wireless electrical connection. Thus, if a first device couples to a second device, that connection may be through a direct electrical connection, through an indirect electrical connection via other devices and connections, through an optical electrical connection, or through a wireless electrical connection.

DETAILED DESCRIPTION

Figure 1:
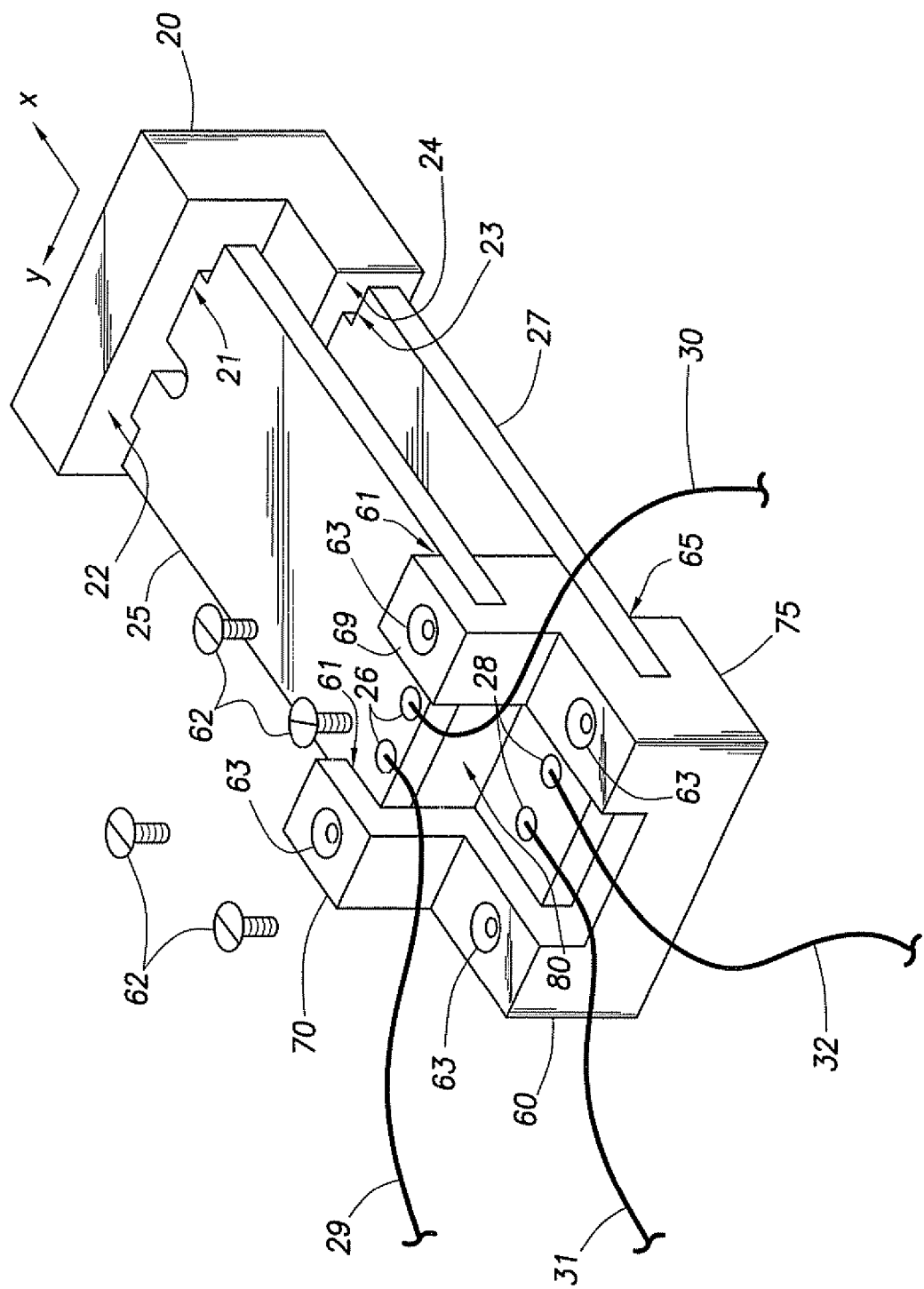
FIG. 1 shows a perspective view of wireless card retention mechanism in accordance with embodiments of the invention.
Figure 2:
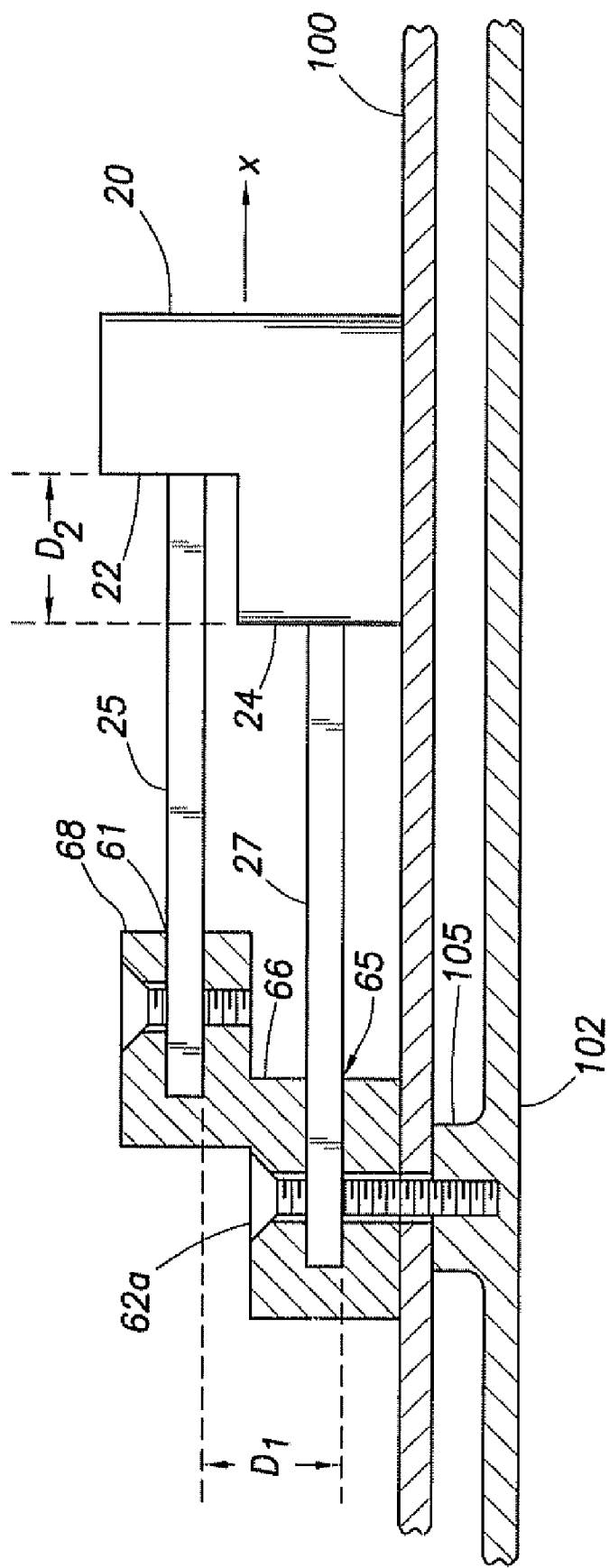
FIG. 2 shows a cross-sectional view of the wireless card retention mechanism in accordance with embodiments of the invention.

FIGS. 1 and 2 show perspective and side views, respectively, of an embodiment of a circuit card retention mechanism that comprises a first bracket 20 and a second bracket 60. The brackets 20, 60 are each mountable to a circuit board 100 and are adapted to retain one or more circuit cards therebetween. The term "bracket" is a broad term intended to include any type of structural mechanism to mate with and help retain one or more circuit cards in place with a host system (e.g., a notebook computer). In at least one embodiment, one or more of the circuit cards comprises wireless circuit cards. A wireless circuit card comprises a radio transceiver and other logic and circuitry that permits a host system containing such a card to receive and transmit wirelessly with other similarly equipped systems. As shown in FIG. 2, the circuit board 100 mounts to a base 102. In some embodiments in which the host system is a computer, the circuit board 100 is the computer's "system board" (also referred to as a "mother board").

In the embodiment shown in FIG. 1, two wireless cards 25 and 27 are shown retained in place between brackets 20 and 60, but in other embodiments the brackets may retain in place only a single wireless card. In yet other embodiments, the brackets may retain in place more than two wireless cards The wireless cards 25, 27 may be separate instances of the same wireless card (i.e., the same type of card such as same model number) or the cards may be different types of wireless cards (e.g., wireless cards that adhere to different wireless communication protocols).

Bracket 20 comprises receiving portions 21 and 23 provided in surfaces 22 and 24. Receiving portions 21, 23 comprise electrical sockets into which corresponding electrical connectors provided on cards 25, 27 can be inserted. The cards' electrical connectors provide electrical contacts for data and/or power. Electrical connections are routed from the receiving portions 21, 23, through bracket 20, and to the circuit board 100 to which the bracket establishes electrical contact. Thus, the bracket 20 provides electrical connectivity between the cards 25, 27 and the circuit board 100.

In accordance with embodiments of the invention, bracket 20 is L-shaped when viewed from the side (FIG. 2). The cards 25, 27 extend away from the plane of surfaces 22 and 24 in a generally perpendicular direction as best shown in FIG. 2. The receiving portions 21, 23 (FIG. 1) provide electrical connectivity between the cards 25, 27 and the circuit board 100, as well as provide structural support for the cards.

The second bracket 60 comprising the card retention mechanism comprises a pair of opposing members 69 and 70 as best shown in FIG. 1. The opposing members 69, 70 project up from a base 75 in a generally stair-shaped arrangement. Thus, the opposing members 69, 70 of bracket 60 generally have a stair-shaped cross-section as best seen in FIG. 2, and the number of "stairs" forming bracket 60 can be varied from that shown in FIG. 1. The opposing members 69 and 70 comprise receiving portions 61 and 65 that are adapted to receive ends of the cards 25, 27 opposite the ends mated to receiving portions 21 and 23 in bracket 20. In accordance with some embodiments of the invention, the receiving portions 61 and 65 of bracket 60 provide structural support for the cards 25, 27 and do not provide electrical connectivity. As such, the bracket 60 is, or has, a non-electrical receiving socket. However, in other embodiments, receiving portions 61, 65 provide electrical connectivity to the cards 25, 27.

As best shown in FIG. 2, the brackets 20 and 60 retain multiple cards therebetween in a stacked arrangement. In at least one embodiment, the cards are spaced apart in a parallel orientation with respect to each other by a distance D1 of about 0.25 inches. Further, the cards are stacked in a staggered arrangement about the x-axis (denoted in FIG. 1). Card 25 is spaced apart from card 27 along the x-axis by a distance D2, although in other embodiments the staggered relationship between the cards could be along the y-axis. In some embodiments, D2 is about 0.25 to 0.5 inches. In the embodiment shown in FIG. 1, the cards 25, 27 are not spaced apart along the y-axis, but in other embodiments, a y-axis spacing could be implemented as desired. Spacing the cards about the x-axis, at least in part, facilitates routing electrical conductors through bracket 20 to the circuit board 100. In other embodiments, the cards are not spaced about either the x-axis or y-axis. One of ordinary skill in the art will appreciate that the aforementioned values for D1 and D2 could be more or less than the values stated.

The opposing members 69 and 70 comprising the second bracket 60 define an exposed region 80. The exposed region permits access to one or more electrical contacts at ends of cards 25 and 27. One or more electrical conductors can be electrically mated to the contacts. In the embodiment in which the cards comprise wireless circuit cards, the contacts comprise electrical contacts for antennas. Card 25 comprises antenna contacts 26 and card 27 comprises antenna contacts 28. Antenna contacts 26, 28 are thus accessible via the exposed region 80 of bracket 60. As such, wires 29, 30, 31, and 32 can be coupled to the antenna contacts. The wires 29-32 electrically connect the cards 25, 27 to antennas mounted remotely from the cards in a suitable location within or on the host system such as at an exposed outer surface of the host system. In some embodiments, the wires 29-32 are soldered to the contacts 26, 28. Staggering the cards 25, 27 along the x-axis permits easier access to contacts 28 of the bottom card 27 than if the cards were not staggered. In other embodiments, each of the contacts 26, 28 can be for a purpose other than antenna contact points.

In at least some embodiments, either or both of the brackets 20 and 60 are fabricated from plastic or other suitable, non-electrically conductive material. In other embodiments, the brackets 20, 60 are formed from an electrically conductive material. The exposed region 80 may be formed from the bracket 60 during fabrication. For example, the exposed region may be formed by cutting away or otherwise removing the bracket's material defining the exposed region. In other embodiments, bracket 60 (as well as bracket 20 if desired) is molded as shown in FIGS. 1 and 2, for example, by injection molding. In such embodiments, the exposed region 80 is created by removing material. Bracket 60 may be formed as one unitary piece or formed from multiple pieces coupled together.

As shown in FIG. 1, each of the opposing members 69 and 70 comprise bores 63 through which fasteners such as screws 62 pass to retain the cards 25 and 27 in place. The cards 25 and 27 have corresponding bores through which the screws 62 also pass. The screws 62 passing through the card 27 are denoted as screws 62a in FIG. 2. Screws 62a pass through corresponding bores in 63 in the bracket 60, card 27, and base 100. The screw 62a threads into a correspondingly threaded member 105 that protrudes upward from base 102. Thus, the screws 62 function to retain the cards 25 and 27 in place within bracket 60 and some of the screws function also to retain bracket 60 in place with respect to circuit board 100 and base 102.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A card retention mechanism, comprising:
 a first bracket mountable to a circuit board;
 a second bracket mountable to said circuit board;
 wherein said first and second brackets are adapted to retain a circuit card therebetween; and
 wherein said second bracket comprises opposing, stair-shaped members that define an exposed region between said members, said exposed region exposes an electrical contact of said circuit card to enable electrical connection of a conductor thereto, each of said members comprises a bore that receives a fastener therethrough for connection to said circuit board.

2. The card retention mechanism of claim 1 wherein said exposed region permits an antenna contact on said circuit card to be accessible.

3. The card retention mechanism of claim 1 wherein said circuit card comprises a wireless circuit card.

4. The card retention mechanism of claim 1 wherein first and second brackets comprise receiving portions for multiple circuit cards thereby permitting multiple circuit cards to be retained between said first and second brackets.

5. The card retention mechanism of claim 4 wherein said multiple circuit cards are retained between the first and second brackets in a stacked arrangement.

6. The card retention mechanism of claim 4 wherein said multiple circuit cards are retained between the first and second brackets in a staggered arrangement.

7. The card retention mechanism of claim 1 wherein said first bracket comprises an electrical socket for receiving a corresponding connector on a first end of said circuit card.

8. The card retention mechanism of claim 7 wherein said second bracket comprises a non-electrical receiving socket that receives a second end of said circuit card.

9. A system, comprising:
 a circuit board;
 a first bracket mountable to said circuit board;
 a second bracket mountable to said circuit board;
 wherein said first and second brackets retain a card therebetween; and
 wherein said second bracket comprises opposing, stair-shaped members defining an exposed region therebetween, said exposed region thereby exposes an electrical contact of said card to enable connection of an electrical conductor thereto, each of said opposing, stair-shaped members comprises a bore that receives a fastener therethrough for connection to said circuit board.

10. The system of claim 9 wherein said electrical conductor is an antenna wire that is adapted to couple said electrical contact to an antenna.

11. The system of claim 9 wherein said card comprises a wireless card.

12. The system of claim 9 wherein first and second brackets comprise receiving portions for multiple cards thereby permitting multiple cards to be retained therebetween.

13. The system of claim 12 wherein said multiple cards are retained between the first and second brackets in a stacked arrangement.

14. The system of claim 9 wherein said first bracket comprises an electrical socket for receiving a corresponding connector on a first end of said card.

15. The system of claim 14 wherein said second bracket comprises a non-electrical receiving socket that receives a second end of said card.

16. A bracket, comprising:
 a base portion adapted to be coupled to a circuit board;
 first and second stair-shaped members projecting away from said base portion, each of said first and second stair-shaped members adapted to receive a portion of a circuit card;
 wherein said first and second stair-shaped members define an exposed region therebetween, said exposed region exposes an antenna contact of said circuit card to be exposed to enable connection of an electrical conductor thereto; and wherein each of said first and second stair-shaped members comprises a bore through which a screw passes to retain said circuit card in place.

17. The bracket of claim 16 wherein each said first and second members comprises a mechanical receiving portion that receives and structurally supports an end portion of said circuit card.

18. The bracket of claim 16 wherein said circuit card comprises a wireless circuit card.

19. The bracket of claim 16 wherein each of said first and second members is adapted to receive end portions of multiple circuit cards.

20. The bracket of claim 19 wherein said first and second members retain said multiple circuit cards in a parallel arrangement.

* * * * *